United States Patent [19]

Stockmeier

[11] Patent Number: 5,311,043
[45] Date of Patent: May 10, 1994

[54] BIDIRECTIONAL SEMICONDUCTOR SWITCH WITH HYBRID CONSTRUCTION

[75] Inventor: Thomas Stockmeier, Baden-Dättwil, Switzerland

[73] Assignee: Asea Brown Boveri Ltd., Baden, Switzerland

[21] Appl. No.: 68,175

[22] Filed: May 28, 1993

[30] Foreign Application Priority Data

Jul. 13, 1992 [DE] Fed. Rep. of Germany ....... 4222973

[51] Int. Cl.$^5$ .................... H01L 29/74; H01L 23/16; H01L 23/28
[52] U.S. Cl. .................... 257/177; 257/119; 257/126; 257/776; 257/786; 257/795
[58] Field of Search ............... 257/119, 126, 177, 773, 257/776, 786, 795

[56] References Cited

U.S. PATENT DOCUMENTS 3,766,634 10/1973 Babcock et al. .
3,994,430 11/1976 Cusano et al. .
5,036,377 7/1991 Pathak et al. .................... 257/119

OTHER PUBLICATIONS

IBM Technical Disclosure Bulletin, vol. 30, No. 6, Nov. 1987, pp. 349–350.
J. Dickson, International Journal for Hybrid Microelectronics, vol. 5, No. 2, Nov. 1982, pp. 103–109. "Direct Bond Copper Technology: Materials, Methods, Applications".
T. Lipo, IEEE Transactions on Power Electronics, vol. 3, No. 2, Apr. 1988, pp. 105–117 "Recent Progress in the Development of Solid-State AC Motor Drives".

*Primary Examiner*—Ngan Ngo
*Attorney, Agent, or Firm*—Oblon, Spivak, McClelland, Maier & Neustadt

[57] ABSTRACT

In a bidirectional semiconductor switch which can be switched on and off, printed conductors which form the main term terminals (1, 2) and the control terminals (3, 4) are applied to a baseplate (9). Applied to the printed conductors, which form the main terminals (1, 2), are at least two reverse-blocking semiconductor components (5a–h) which can be switched on and off. The control electrodes (8a, 8e) and the second main electrodes (7a, 7e) of the semiconductor components (5a–h) are interconnected in such a way that the semiconductor switch has the required bidirectional switching function.

14 Claims, 1 Drawing Sheet

BIDIRECTIONAL SEMICONDUCTOR SWITCH WITH HYBRID CONSTRUCTION

BACKGROUND OF THE INVENTION

1. Field of the Invention

The invention relates to a bidirectional semiconductor switch in the field of power electronics.

2. Discussion of Background

Such a bidirectional semiconductor switch has already been described in German Offenlegungsschrift DE 4,011,509.

In recent years, modern converter concepts have been presented in the field of power electronics for industrial drives (see in this connection, for example, T.A. Lipo, IEEE Transactions on Power Electronics, Vol. 13, No. 2. April 1988, pages 105-117). However, the realisation of these converter circuits (for example, of the matrix converters mentioned in the article by Lipo) requires components which have a bidirectional conductivity and blocking ability. The application of such components, which can be switched on and off in two directions, renders it possible to save the otherwise necessary freewheeling diode and largely to dispense with protective elements.

In the abovementioned Swiss patent (CH 1491/89-8), the bidirectional switching function is achieved by a subassembly which has control electrodes on the front and on the rear. This is a thyristor with bilateral, MOS-controlled short circuits, which guarantee the bidirectional blocking ability and conductivity.

However, a component which has control electrodes on both sides not only places high demands on the production process, but in addition the cooling and the integration of the subassembly into a housing are problematical. Such components are therefore also very expensive.

SUMMARY OF THE INVENTION

Accordingly, one object of the invention is to provide a novel bidirectional semiconductor switch which by contrast with the prior art can be realized simply and is distinguished by low production costs and a simple cooling possibility.

The essence of the invention resides, in particular, in that the bidirectional switching function is realized in a hybrid fashion. For this purpose, at least two reverse-conducting semiconductor components which can be switched on and off are soldered by their first main face or main electrode onto the printed conductors. The control electrodes or the second main electrodes of the semiconductor components are interconnected with the control terminals or the main terminals in such a way that the semiconductor switch has a bidirectional switching function.

The advantage of the design according to the invention consists in that it is possible to use components according to the present state of knowledge. The switch is therefore simple to realize, has low production costs and also poses less stringent demands on the cooling technology. Since the switch according to the invention has control electrodes only on one side, the cooling can be set up substantially more simply and the semiconductor switch can be integrated without difficulty into a housing. Overall, these advantages contribute to an increased reliability of the bidirectional switch.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
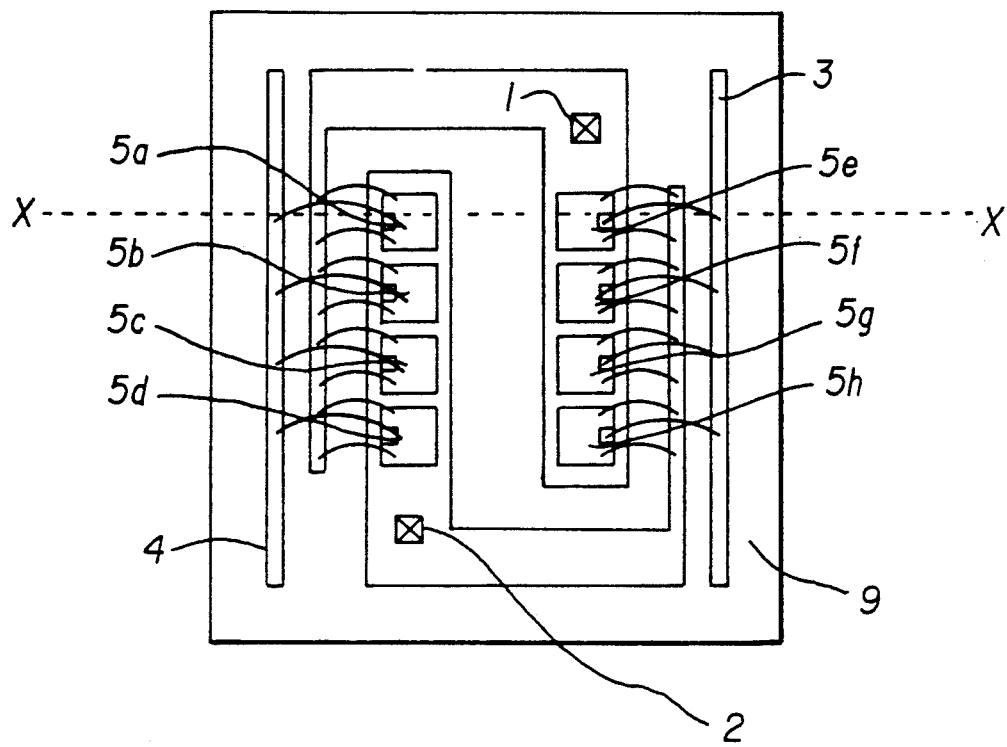
FIG. 1 shows a top view of a bidirectional semiconductor switch according to the invention.

The designations used in the drawings are listed in summary fashion together with their significance in the list of designations.

DESCRIPTION OF THE PREFERRED EMBODIMENTS

Referring now to the drawings, wherein like reference numerals designate identical or corresponding parts throughout the several views, FIG. 1 shows a top view of a bidirectional semiconductor switch according to the invention. The switch comprises two main terminals (1, 2) through which the current to be switched flows, and two control terminals (3, 4) and a number of semiconductor components (5a–5h). The semiconductor components (5a–5h) consist of a number of differently doped silicon layers. The layers are bounded by a first and a second main face (6a, 6e). The first main face has a first main electrode (generally, the anode), and the second main face (6a, 6e) has a second main electrode (7a, 7e) (generally, the cathode) and a control electrode (8a, 8e). The semiconductor components (5a–5h) are reverse-blocking semiconductor switches, preferably having a MOS-controlled structure such as MCT, IGBT or MOSFET, which can be switched on and off via the control electrode (8a, 8e).

Printed conductors are applied to a baseplate (9) which preferably consists of DCB (direct-copper-bonding) ceramic in such a way that they form the abovementioned main terminals (1, 2) and the control terminals (3, 4). The methods customary for handling DCB ceramic are used to apply the printed conductors. The printed conductors of the main terminals (1, 2) are formed, for example, by two interlocking "U"s whose inner limbs are wider. The printed conductor of the first or second control terminal extends parallel to the outer, thinner limb.

At least two semiconductor components (5a, 5e) are applied to the baseplate with their first main face in such a way that the first main electrodes are electrically connected to the first main terminal (1) or to the second main terminal (2). The second main electrodes (7a, 7e) are now interconnected with the main terminals (1, 2), and the control electrodes (8a, 8e) are now interconnected with the control terminals (3, 4), in such a way that the resulting semiconductor switch has a bidirectional switching function.

In order to obtain the bidirectional switching function, the second main electrode (7e) of that semiconductor component (5e) whose first main electrode is connected to the first main terminal (1) is connected to the second main terminal (2). The control electrode (8e) of the same semiconductor component (5e) is connected to the first control terminal (3). The second main electrode (7a) of that semiconductor component (5a) whose first main electrode is connected to the second main terminal (2) is connected to the first main terminal (1), and the control electrode (8a) of the same semiconductor component (5a) is connected to the second control terminal (4). The wire-bonding technique or the foil-clip technique is preferably applied as the connecting technique. However, the invention is not, of course, limited to these two techniques, rather it is possible to apply any connecting technique which is suitable for the hybrid realization of such a semiconductor switch.

The functioning of the semiconductor switch according to the invention is to be explained below with the aid of exemplary situations.

The semiconductor components represent a current valve which can conduct current only in one direction and can be switched on and off. Two of these valves are connected in reverse parallel in each case.

In a first situation, the current is to flow from the first main terminal (1) to the second main terminal (2). For this purpose, the semiconductor component (5e) is switched on via a corresponding control signal at the first control terminal (3), and thereby put into the conducting state. The semiconductor component (5a) is switched off via a corresponding control signal at the second control terminal (4) or remains switched off, since the semiconductor components are, after all, reverse blocking. The current flows in this situation from the first main terminal (1) via the first main electrode of the semiconductor component (5e) to the second main electrode (7e) and from there to the second main terminal (2) via the wire-bonded wires. The current path of the first main terminal (1)—first main electrode of the semiconductor component (5a)—second main electrode (7a)—wire-bonded wires—second main terminal (2) is blocked, since the second semiconductor component (5a) has a blocking effect.

For the case in which the current is to flow from the second main terminal (2) to the first main terminal (1), the semiconductor component (5a) takes over the task of the conducting switch, and the semiconductor component (5e) that of the blocking switch. The control signals are to be matched accordingly.

For the case in which no current at all is to flow, both semiconductor components (5a, 5e) are switched off by means of corresponding control signals. Consequently, both current paths are blocked and a current cannot flow.

For the sake of simplicity, only two semiconductor components (5a, 5e) have so far been mentioned. It is preferred, however, to use a plurality of semiconductor components in parallel, as is represented in FIG. 1 with the example of 8 components. In the mode of functioning explained above, the semiconductor component (5a) is to be replaced for this purpose by the group (5a–d), and (5e) by (5e–h), respectively. The number of components is, however, open upwards.

Figure 2:
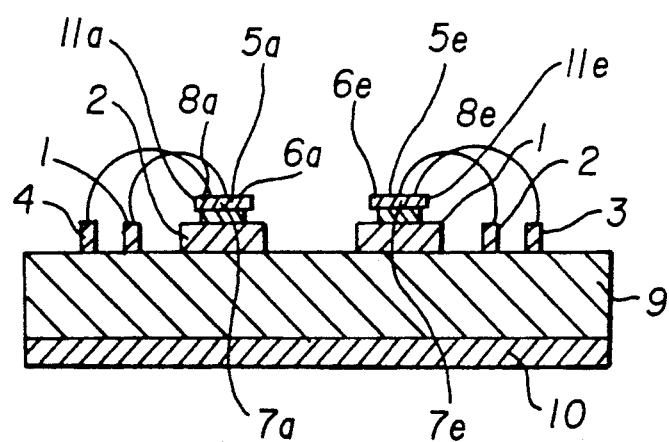
FIG. 2 shows a section through a semiconductor switch according to the invention along the line x—x.

FIG. 2 shows a section through a semiconductor switch along the line x—x, and represents how the semiconductor components (5a–h) are applied to the printed conductors.

The semiconductor components (5a, 5e) are soldered to a contact plate (11a, 11e) which, for its part, is soldered to the printed conductor (2 or 1). The contact plate (11a, 11e) is electrically connected to the first main electrode of the semiconductor component. The distance of the first main face of the semiconductor component (5a or 5e) from the printed conductor (1 or 2) must be selected so as to prevent a breakdown of the voltage applied between the printed conductor and the semiconductor component if the component blocks.

Since the baseplate consists of DCB ceramic, it has a copper layer (10) on the underside.

Thus, overall the invention provides a bidirectional semiconductor switch which is constructed from commercially available components and is distinguished in particular by a high reliability due to simple realizability, effective and simple cooling and simple connecting technology, and which can, moreover, be produced cost-effectively.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A bidirectional semiconductor switch comprising:
   a baseplate;
   a first main terminal formed on the baseplate;
   a second main terminal formed on the baseplate;
   a first control electrode formed on the baseplate;
   a second control electrode formed on the baseplate;
   at least two reverse blocking semiconductors which can be switched on and off and which are formed of a plurality of doped silicon layers;
   wherein a first of the at least two reverse blocking semiconductors is formed on the first main terminal to be electrically connected to the first main terminal, and has a first connection to the second main terminal and a second connection to the first control electrode;
   wherein a second of the at least two reverse blocking semiconductors is formed on the second main terminal to be electrically connected to the second main terminal, and has a third connection to the first main terminal and a fourth connection to the second control electrode.

2. The bidirectional semiconductor switch according to claim 1, wherein the baseplate comprises direct-copper-bonding ceramic.

3. The bidirectional semiconductor switch according to claim 2, wherein the first, second, third and fourth connections are wire-bonding connections.

4. The bidirectional semiconductor switch according to claim 2, wherein the first, second, third and fourth connections are foil-clip connections.

5. The bidirectional semiconductor switch according to any one of claims 1–4, further comprising a contact plate formed between the at least two reverse blocking semiconductor components and the first and second main terminals.

6. The bidirectional semiconductor switch according to any one of claims 1–4, wherein the semiconductor components are MOS-controlled structures.

7. The bidirectional semiconductor switch according to any one of claims 1–4, wherein the baseplate is inserted into a housing which is encapsulated in plastic, the first and second main terminals and the first and second control terminals being led out of the housing.

8. A bidirectional semiconductor switch comprising:
   a baseplate;
   a first main terminal formed on the baseplate;
   a second main terminal formed on the baseplate;
   a first control electrode formed on the baseplate;
   a second control electrode formed on the baseplate;

a plurality of reverse blocking semiconductors which can be switched on and off and which are formed of a plurality of doped silicon layers;

wherein a first group of the plurality of reverse blocking semiconductors are formed on the first main terminal to be electrically connected to the first main terminal, and have a first connection to the second main terminal and a second connection to the first control electrode;

wherein a second group of the plurality of reverse blocking semiconductors are formed on the second main terminal to be electrically connected to the second main terminal, and have a third connection to the first main terminal and a fourth connection to the second control electrode.

9. The bidirectional semiconductor switch according to claim 8, wherein the baseplate comprises direct-copper-bonding ceramic.

10. The bidirectional semiconductor switch according to claim 9, wherein the first, second, third and fourth connections are wire-bonding connections.

11. The bidirectional semiconductor switch according to claim 9, wherein the first, second, third and fourth connections are foil-clip connections.

12. The bidirectional semiconductor switch according to claim 8, further comprising a contact plate formed between the plurality of reverse blocking semiconductor components and the first and second main terminals.

13. The bidirectional semiconductor switch according to claim 8, wherein the plurality of semiconductor components are MOS-controlled structures.

14. The bidirectional semiconductor switch according to claim 8, wherein the baseplate is inserted into a housing which is encapsulated in plastic, the first and second main terminals and the first and second control terminals being led out of the housing.

* * * * *